(12) United States Patent
Pisek

(10) Patent No.: US 7,979,781 B2
(45) Date of Patent: Jul. 12, 2011

(54) METHOD AND SYSTEM FOR PERFORMING VITERBI DECODING USING A REDUCED TRELLIS MEMORY

(75) Inventor: Eran Pisek, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 1176 days.

(21) Appl. No.: 11/708,195

(22) Filed: Feb. 20, 2007

(65) Prior Publication Data

US 2008/0112514 A1  May 15, 2008

Related U.S. Application Data

(60) Provisional application No. 60/858,322, filed on Nov. 10, 2006.

(51) Int. Cl.
*H03M 13/00* (2006.01)

(52) U.S. Cl. .................. 714/795; 714/755; 714/788

(58) Field of Classification Search .................. 714/795, 714/755, 786, 788, 762, 701
See application file for complete search history.

(56) References Cited

U.S. PATENT DOCUMENTS

| | | | |
|---|---|---|---|
| 6,608,870 B1 * | 8/2003 | Fimoff | 375/270 |
| 6,687,310 B1 * | 2/2004 | Fimoff et al. | 375/265 |
| 6,871,303 B2 * | 3/2005 | Halter | 714/702 |
| 2002/0110183 A1 * | 8/2002 | Kaewell, Jr. | 375/148 |
| 2003/0012290 A1 * | 1/2003 | Fimoff et al. | 375/265 |

* cited by examiner

*Primary Examiner* — Fritz Alphonse

(57) ABSTRACT

A method for performing Viterbi decoding using a reduced trellis memory is provided that includes dividing a block of data into a plurality of segments. A feed-forward process is performed on each of the segments to generate a trellis for each of the segments. A traceback process is performed on each of a plurality of overlapping segment pairs, each segment pair comprising a first segment and a second segment, to generate a traceback result for the first segment and a traceback result for the second segment. The traceback result for the second segment is discarded to generate a decoder output based on the traceback result for the first segment.

23 Claims, 7 Drawing Sheets

METHOD AND SYSTEM FOR PERFORMING VITERBI DECODING USING A REDUCED TRELLIS MEMORY

CROSS-REFERENCE TO RELATED APPLICATION AND CLAIM OF PRIORITY

This application is related to U.S. Provisional Patent No. 60/858,322, filed Nov. 10, 2006, titled "Method and Apparatus for Memory Savings in Viterbi Algorithm in Software Defined Radio Systems." Provisional Patent No. 60/858,322 is assigned to the assignee of this application and is incorporated by reference as if fully set forth herein. This application claims priority under 35 U.S.C. §119(e) to Provisional Patent No. 60/858,322.

This application is related to U.S. patent application Ser. No. 11/123,313, filed on May 6, 2005, issued Feb. 23, 2010, as U.S. Pat. No. 7,668,992, and titled "Context-based Operation Reconfigurable Instruction Set Processor and Method of Operation." application Ser. No. 11/123,313 is assigned to the assignee of this application and is incorporated by reference into this application as if fully set forth herein.

TECHNICAL FIELD OF THE INVENTION

The present application relates generally to wireless communication systems and, more specifically, to a method for performing Viterbi decoding using a reduced trellis memory.

BACKGROUND OF THE INVENTION

To improve throughput, many communication systems implement a forward error correction (FEC) technique. This is particularly true of wireless communication systems, such as cellular networks. One of the most common FEC techniques is known as convolutional coding with Viterbi decoding. This technique is particularly useful for channels in which additive white Gaussian noise distorts the transmitted signal. A Viterbi decoder is the maximum likelihood sequence decoder for a convolutional code. The Viterbi algorithm is based on the dependency between consecutive transmitted bits. In order to detect the original information bits, the decoder builds a record of limited possible history transmitted bits based on the dependency of the bits. This history chain is called a trellis and usually requires a dedicated memory block to save all possible history paths.

The size of the trellis memory in bits (TMS) depends on the depth of the dependency between the transmitted bits (called constraint length, or K) and the block size of the information bits (N). Generally, TMS=$(2^{K-1})\times N$. Therefore, the size of the trellis memory increases linearly with N and exponentially with K. For example, in WCDMA, K=9, which means that for a block size of 1024 bits, the required trellis memory is 256*1024=256 Kbits or 32 Kbyte of memory. This size of memory can significantly increase the total size of the decoder hardware.

In order to overcome the problems caused by a large memory size, several solutions have been introduced, including a sliding window approach that cuts down the original block into sub-blocks and processes each sub-block separately. This approach performs both a feed-forward and a traceback process on each sub-block. The feed-forward process is performed while the path metric state from a previous sub-block is restored, and a learning period is performed during the traceback process. However, in order to process each sub-block separately while restoring path metrics and performing learning periods, this approach requires a large overhead MIPS time from a host processor. Therefore, there is a need in the art for a Viterbi decoder capable of decoding data using a reduced trellis memory while minimizing performance degradation.

SUMMARY OF THE INVENTION

A method for performing Viterbi decoding using a reduced trellis memory is provided. According to an advantageous embodiment, the method includes dividing a block of data into a plurality of segments. A feed-forward process is performed on each of the segments to generate a trellis for each of the segments. A traceback process is performed on each of a plurality of overlapping segment pairs, each segment pair comprising a first segment and a second segment, to generate a traceback result for the first segment and a traceback result for the second segment. The traceback result for the second segment is discarded to generate a decoder output based on the traceback result for the first segment.

According to another embodiment of the present disclosure, a method for performing Viterbi decoding using a reduced trellis memory is provided that includes dividing a block of data into a plurality of segments. A feed-forward process is performed on a first segment to generate a trellis for the first segment. The feed-forward process is performed on a second segment to generate a trellis for the second segment. A single traceback process is performed on the trellis for the first segment and the trellis for the second segment to generate a traceback result for the first segment and a traceback result for the second segment. The traceback result for the second segment is discarded to generate a decoder output based on the traceback result for the first segment.

According to yet another embodiment of the present disclosure, a Viterbi decoder is provided that includes a block memory, a sliding window processor and a reduced trellis memory. The block memory is operable to store a block of data divided into a plurality of segments. The sliding window processor is coupled to the block memory and is operable to perform a feed-forward process on each of the segments to generate a trellis for each of the segments. The reduced trellis memory is coupled to the sliding window processor and is operable to store the trellis for a first segment and the trellis for a second segment. The sliding window processor is further operable (i) to perform a single traceback process on the trellis for the first segment and the trellis for the second segment to generate a traceback result for the first segment and a traceback result for the second segment and (ii) to discard the traceback result for the second segment to generate a decoder output based on the traceback result for the first segment.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the term "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged processing system.

In one embodiment of the disclosure, the reconfigurable Viterbi decoder described herein may be implemented using a context-based operation reconfigurable instruction set processor (CRISP) device. CRISP devices are described in detail in U.S. patent application Ser. No. 11/123,313, which was incorporated by reference above.

Figure 1:
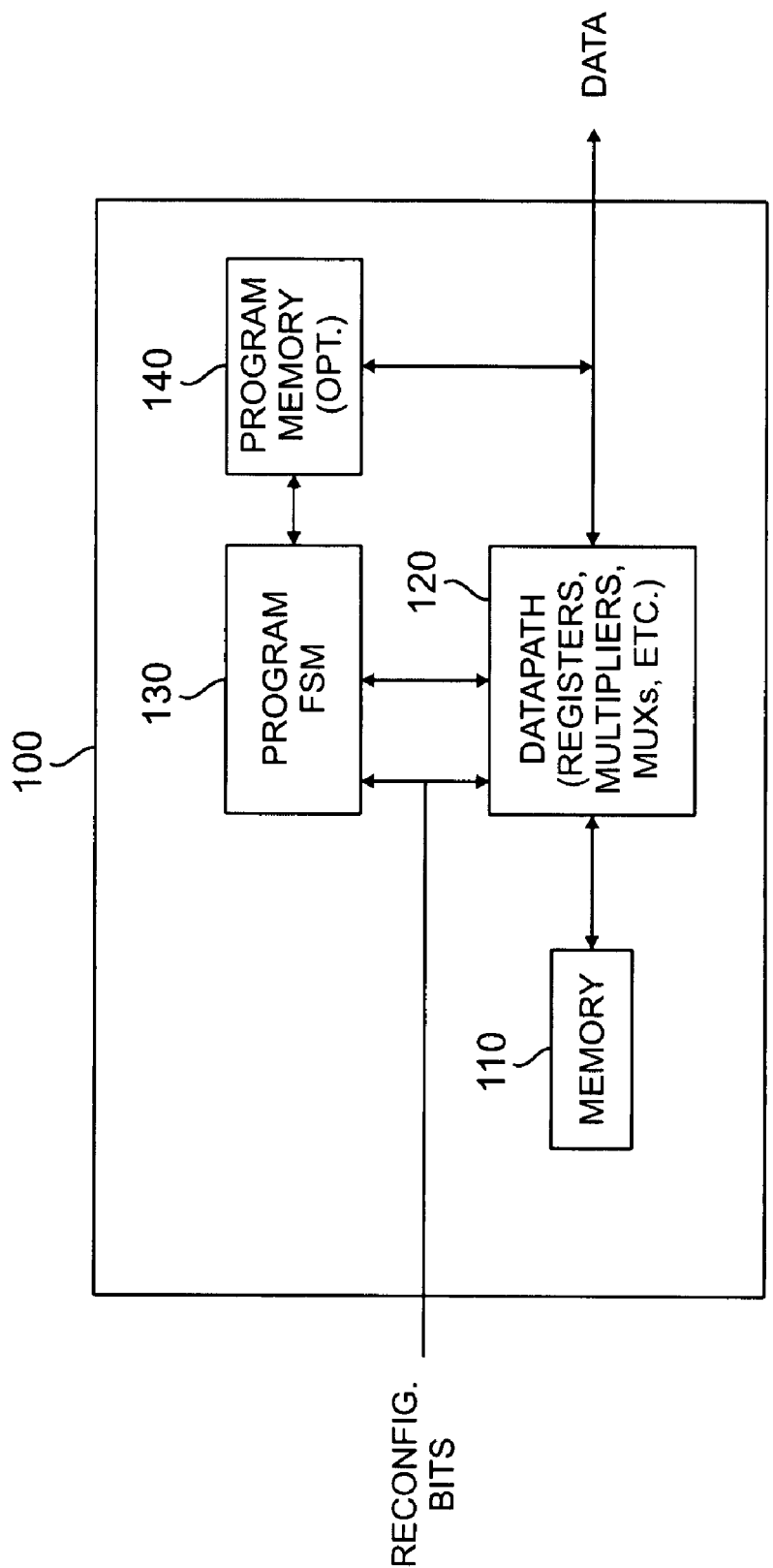
FIG. 1 is a block diagram of a context-based operation reconfigurable instruction set processor (CRISP) that may be used to implement a Viterbi decoder having a reduced trellis memory according to the principles of the disclosure.

FIG. 1 is a block diagram of CRISP 100, which may be used to implement a Viterbi decoder having a reduced trellis memory according to the principles of the present disclosure. CRISP 100 comprises memory 110, programmable data path circuitry 120, programmable finite state machine 130, and optional program memory 140. A context is a group of instructions of a data processor that are related to a particular function or application, such as Viterbi decoding instructions. As described in U.S. patent application Ser. No. 11/123,313, CRISP 100 implements only a subset of context-related instructions in an optimum manner.

CRISP 100 defines the generic hardware block that usually consists of higher level hardware processor blocks. The principle advantage to CRISP 100 is that CRISP 100 breaks down the required application into two main domains, a control domain and a data path domain, and optimizes each domain separately. By performing Viterbi decoding in CRISP 100, the disclosed Viterbi decoder reduces the problems related to flexibility and power consumption that affect conventional Viterbi decoders.

The control domain is implemented by programmable finite state machine 130, which may comprise a DSP, an MCU or another prior art device. Programmable FSM 130 is configured by reconfiguration bits received from an external controller (not shown). Programmable FSM 130 may execute a program stored in associated optional program memory 140. The program may be stored in program memory 140 via the DATA line from an external controller (not shown). Memory 110 is used to store application data used by data path circuitry 120.

Programmable data path circuitry 120 is divided into sets of building blocks that perform particular functions (e.g., registers, multiplexers, multipliers, and the like). Each of the building blocks is both reconfigurable and programmable to allow maximum flexibility. The division of programmable data path circuitry 120 into functional blocks depends on the level of reconfigurability and programmability required for a particular application.

Since different contexts are implemented by separate CRISP devices that work independently of other CRISP devices, implementing a Viterbi decoder using one or more CRISP devices provides an efficient power management scheme that is able to shut down a CRISP when the CRISP is not required. This assures that only the CRISPs that are needed at a given time are active, while other idle CRISPs do not consume significant power.

Figure 2:
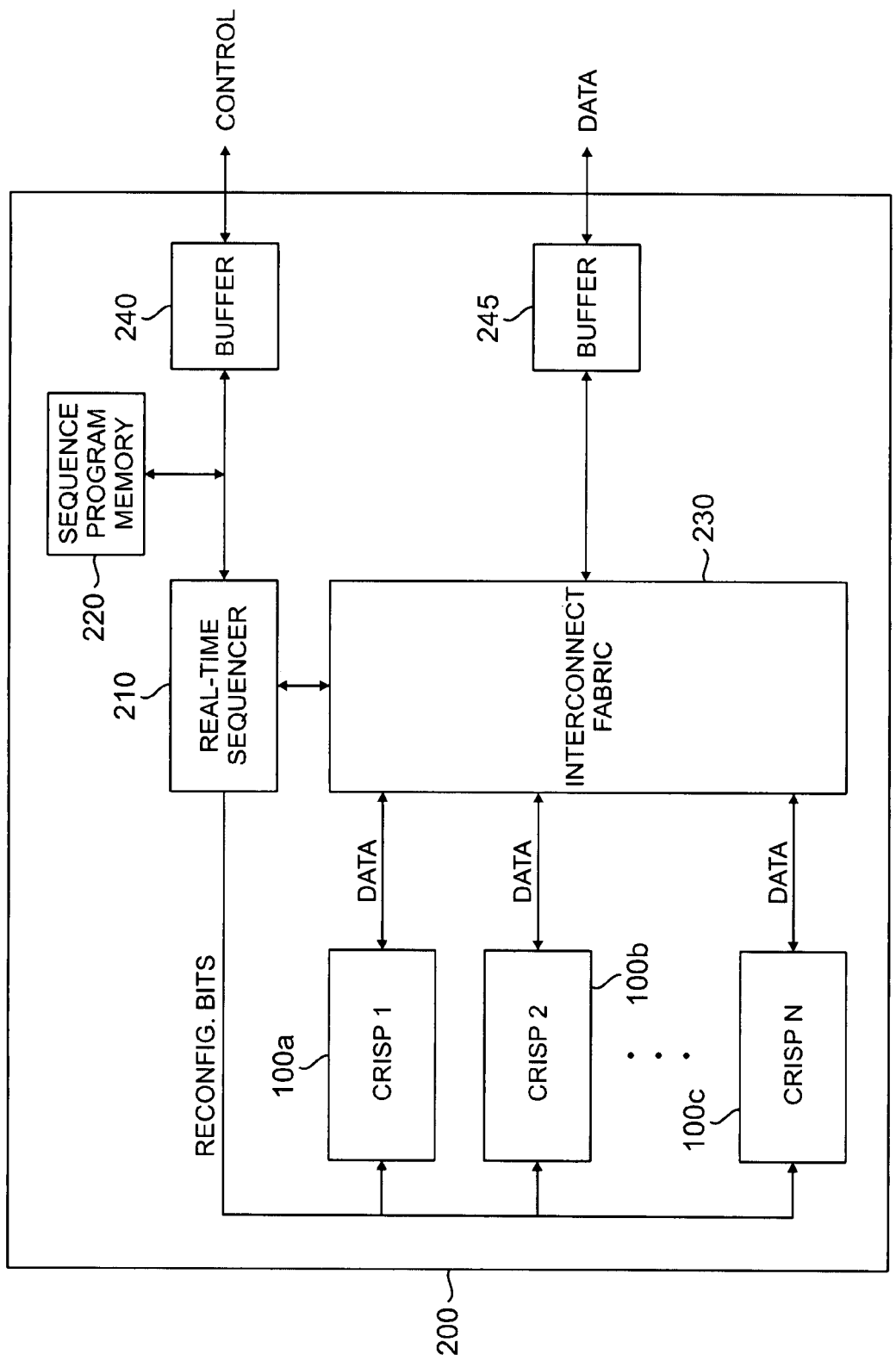
FIG. 2 is a block diagram of a reconfigurable processing system according to the principles of the disclosure.

FIG. 2 is a block diagram of reconfigurable processing system 200 according to one embodiment of the present disclosure. Reconfigurable processing system 200 comprises N CRISPs, such as CRISPs 100a, 100b, and 100c, which are arbitrarily labeled CRISP 1, CRISP 2 and CRISP N. Reconfigurable processing system 200 further comprises real-time sequencer 210, sequence program memory 220, programmable interconnect fabric 230, and buffers 240 and 245.

Reconfiguration bits may be loaded into CRISPs 100a, 100b, and 100c from the CONTROL line via real-time sequencer 210 and buffer 240. A control program may also be loaded into sequence program memory 220 from the CONTROL line via buffer 240. Real-time sequencer 210 sequences the contexts to be executed by each one of CRISPs 100a-c by retrieving program instructions from program memory 220 and sending reconfiguration bits to CRISPs 100a-c. In one embodiment, real-time sequencer 210 may comprise a stack processor, which is suitable to operate as a real-time scheduler due to its low latency and simplicity.

Reconfigurable interconnect fabric 230 provides connectivity between each one of CRISPs 100a-c and an external DATA bus via bi-directional buffer 245. In one embodiment of the present disclosure, each one of CRISPs 100a-c may act as a master of reconfigurable interconnect fabric 230 and may initiate address access. The bus arbiter for reconfigurable interconnect fabric 230 may be internal to real-time sequencer 210.

In one embodiment, reconfigurable processing system 200 may be a cell phone or a similar wireless device or may be a data processor for use in a laptop computer. In a wireless device embodiment based on a software-defined radio (SDR) architecture, each one of CRISPs 100a-c is responsible for executing a subset of context-related instructions that are associated with a particular reconfigurable function. For example, CRISP 100a may be configured to execute context-related instructions that process CDMA baseband signals or OFDMA baseband signals. CRISP 100*b* may be configured to execute context-related instructions that act as a memory controller. CRISP 100*c* may be configured to execute context-related instructions that perform Viterbi decoding.

Since CRISP devices are largely independent and may be run simultaneously, a Viterbi decoder implemented using one or more CRISP devices has the performance advantage of parallelism without incurring the full power penalty associated with running parallel operations. The loose coupling and independence of CRISP devices allows them to be configured for different systems and functions that may be shut down separately.

Figure 3:
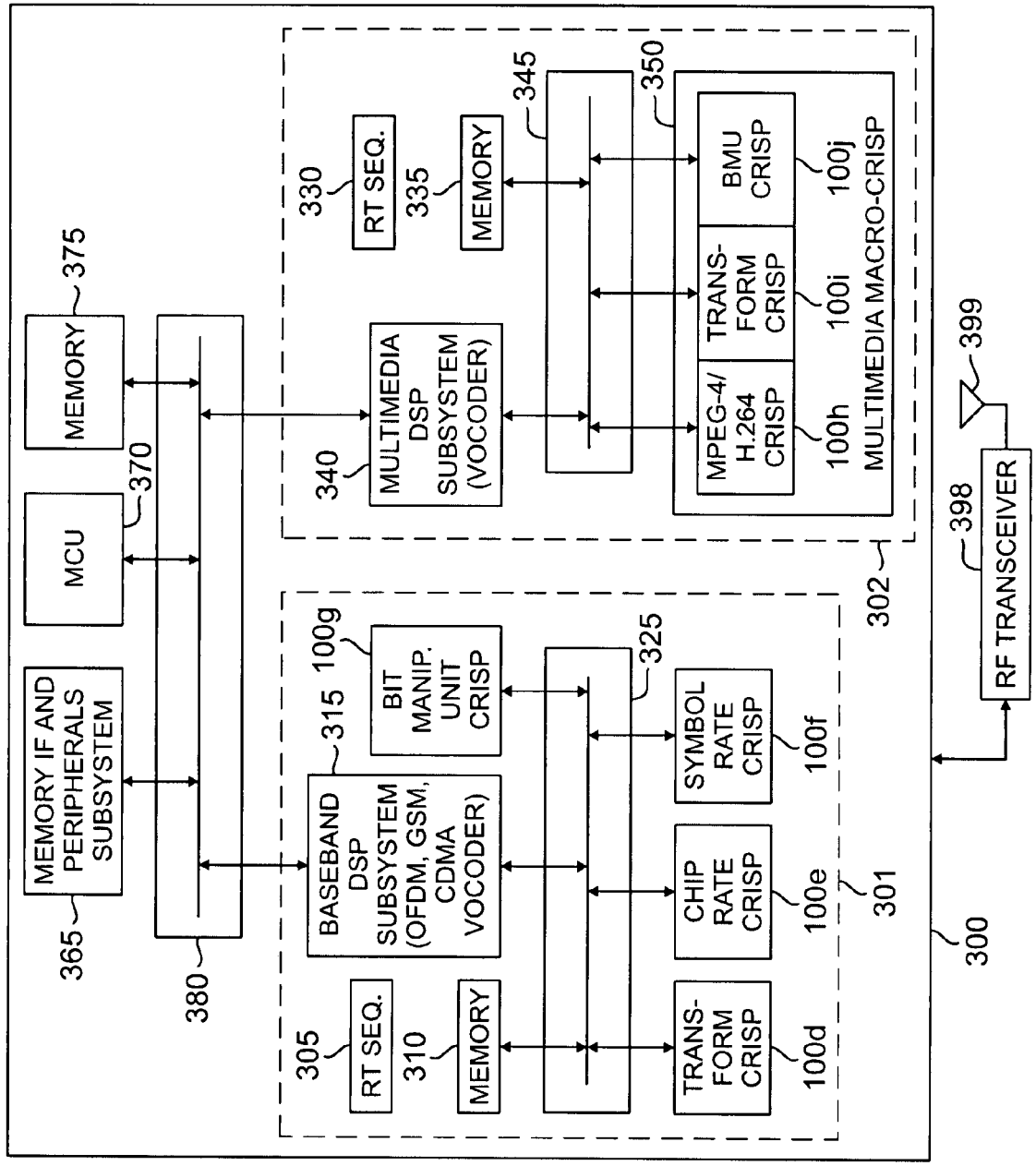
FIG. 3 is a block diagram of a multi-standard software-defined radio (SDR) system that implements a reconfigurable Viterbi decoder that may include a reduced trellis memory according to the principles of the disclosure.

FIG. 3 is a block diagram of multi-standard SDR system 300, which implements a reconfigurable Viterbi decoder that may include a reduced trellis memory according to the principles of the disclosure. SDR system 300 may comprise a wireless terminal (or mobile station, subscriber station, etc.) that accesses a wireless network, such as, for example, a GSM or CDMA cellular telephone, a PDA with WCDMA, IEEE-802.11x, OFDM/OFDMA capabilities, or the like.

Multi-standard SDR system 300 comprises baseband subsystem 301, applications subsystem 302, memory interface (IF) and peripherals subsystem 365, main control unit (MCU) 370, memory 375, and interconnect 380. MCU 370 may comprise, for example, a conventional microcontroller or a microprocessor (e.g., x86, ARM, RISC, DSP, etc.). Memory IF and peripherals subsystem 365 may connect SDR system 300 to an external memory (not shown) and to external peripherals (not shown). Memory 375 stores data from other components in SDR system 300 and from external devices (not shown). For example, memory 375 may store a stream of incoming data samples associated with a down-converted signal generated by radio frequency (RF) transceiver 398 and antenna 399 associated with SDR system 300. Interconnect 380 acts as a system bus that provides data transfer between subsystems 301 and 302, memory IF and peripherals subsystem 365, MCU 370, and memory 375.

Baseband subsystem 301 comprises real-time (RT) sequencer 305, memory 310, baseband DSP subsystem 315, interconnect 325, and a plurality of special purpose CRISPs, including transform CRISP 100*d*, chip rate CRISP 100*e*, symbol rate CRISP 100*f*, and bit manipulation unit (BMU) CRISP 100*g*. By way of example, transform CRISP 100*d* may implement a Fast Fourier Transform (FFT) function, chip rate CRISP 100*e* may implement a correlation function for a CDMA signal, and symbol rate CRISP 100*f* may implement a Viterbi decoder function.

In such an embodiment, transform CRISP 100*d* may receive samples of an intermediate frequency (IF) signal stored in memory 375 and perform an FFT function that generates a sequence of chip samples at a baseband rate. Next, chip rate CRISP 100*e* receives the chip samples from transform CRISP 100*d* and performs a correlation function that generates a sequence of data symbols. Next, symbol rate CRISP 100*f* receives the symbol data from chip rate CRISP 100*e* and performs Viterbi decoding to recover the baseband user data. The baseband user data may then be used by applications subsystem 302.

In one embodiment of the present disclosure, symbol rate CRISP 100*f* may comprise two or more CRISPs that operate in parallel. Also, by way of example, BMU CRISP 100*g* may implement such functions as variable length coding, cyclic redundancy check (CRC), convolutional encoding, and the like. Interconnect 325 acts as a system bus that provides data transfer between RT sequencer 305, memory 310, baseband DSP subsystem 315 and CRISPs 100*d*-100*g*.

Applications subsystem 302 comprises real-time (RT) sequencer 330, memory 335, multimedia DSP subsystem 340, interconnect 345, and multimedia macro-CRISP 350. Multimedia macro-CRISP 350 comprises a plurality of special purpose CRISPs, including MPEG-4/H.264 CRISP 100*h*, transform CRISP 100*i*, and BMU CRISP 100*j*. In one embodiment of the disclosure, MPEG-4/H.264 CRISP 100*h* performs motion estimation functions and transform CRISP 100*i* performs a discrete cosine transform (DCT) function. Interconnect 380 provides data transfer between RT sequencer 330, memory 335, multimedia DSP subsystem 340, and multimedia macro-CRISP 350.

In the embodiment in FIG. 3, the use of CRISP devices enables applications subsystem 302 of multi-standard SDR system 300 to be reconfigured to support multiple video standards with multiple profiles and sizes. Additionally, the use of CRISP devices enables baseband subsystem 301 of multi-standard SDR system 300 to be reconfigured to support multiple air interface standards. Thus, SDR system 300 is able to operate in different types of wireless networks (e.g., CDMA, GSM, 802.11x, etc.) and can execute different types of video and audio formats. However, the use of CRISPS according to the principles of the present disclosure enables SDR system 300 to perform these functions with much lower power consumption than conventional wireless devices having comparable capabilities.

Figure 4:
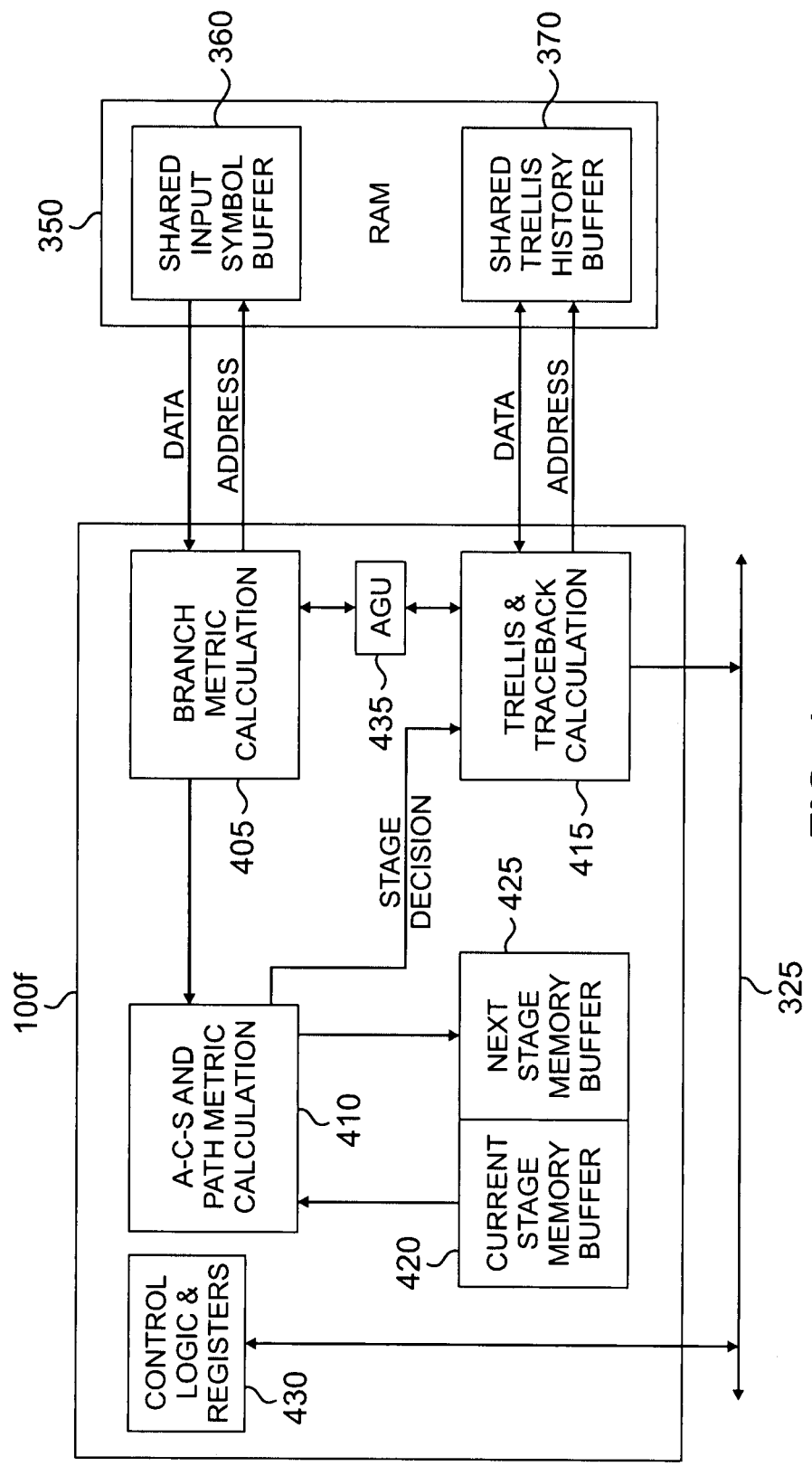
FIG. 4 is a block diagram of a reconfigurable Viterbi decoder implemented in a CRISP according to the principles of the disclosure.

FIG. 4 is a block diagram of a reconfigurable Viterbi decoder implemented in CRISP 100*f* according to the principles of the disclosure. The reconfigurable Viterbi decoder comprises branch metric calculation block 405, add-compare-select (ACS) and path metric calculation block 410, trellis and traceback calculation block 415, current stage memory buffer 420, next stage memory buffer 425, control logic and registers block 430, and address generation unit (AGU) 435. The reconfigurable Viterbi decoder is associated with memory 350, which may be a separate device from CRISP 100*f*, as illustrated in FIG. 4, or may be an integral part of CRISP 100*f*. Memory 350 is logically divided into shared input symbol buffer 360 and shared trellis history buffer 370. In one embodiment, memory 350 may comprise a 32 Kbyte random access memory (RAM). However, as described in more detail below in connection with FIGS. 5-7, memory 350 may comprise a significantly reduced size based on a reduced size for shared trellis history buffer 370.

Control logic and registers block 430 comprises a programmable finite state machine and associated control registers. Control logic and registers block 430 controls the overall operation of CRISP 100*f* and reconfigures the functional blocks of the data path, including, for example, branch metric calculation block 405, add-compare-select (ACS) and path metric calculation block 410, trellis and traceback calculation block 415, current stage memory buffer 420, and next stage memory buffer 425.

Address generation unit 435 controls the read and write operations to memory 350 that are made by branch metric calculation block 405 and trellis and traceback calculation block 415. Chip rate CRISP 100*e* or another component in baseband subsystem 301 writes symbol data samples into shared input symbol buffer 360. Branch metric calculation block 405 then reads the symbol data samples from shared input symbol buffer 360. Trellis and traceback calculation block 415 writes hard decoded trellis data in shared trellis history buffer 370 and reads back the stored hard decoded trellis data in later cycles.

As is well known, the Viterbi algorithm is often represented as a trellis diagram. The trellis is a time-indexed version of a state diagram. Each time instant in the trellis may contain two states, four states, eight states, or more. The maximum likelihood detection of a digital stream with intersymbol interference can be described as finding the most probable path through a trellis of state transitions (branches). Each state corresponds to a possible pattern of recently received data bits and each branch of the trellis corresponds to the reception of the next (noisy) input. The branch metrics represent the costs of traversing along specific branches. The path (or state) metrics accumulate the minimum cost of arriving at a specific state. The path metrics are updated using an add-compare-select recursion. At each time instant, the branch metrics are added to the path (state) metrics of the previous time instant. The smallest path metric is then selected to be the new path metric for each state. Finally, after all of the input symbol samples are processed, the minimum path value represents the survivor sequence. Tracing backwards through the trellis gives the likely sequence of transmitted data.

Branch metric calculation block 405 is a reconfigurable device that is reconfigured by means of control parameters and data written into control logic and registers block 430. Branch metric calculation block 405 calculates four possible branch metric values by calculating the distances of input symbol samples from target values according to well-known principles. By way of example, branch metric calculation block 405 may read in 8-bit "soft" symbol samples (e.g., 256 level 2s complement) from shared input symbol buffer 360 and may output four branch metric values, each containing 16 bits. The branch metric values are typically Hamming distances (or other metric values) that are computed at each time instance for the paths between the states at the previous time instant and the states at the current time instant.

ACS and path metric calculation block 410 also is a reconfigurable device that is reconfigured by means of control parameters and data written into control logic and registers block 430. ACS and path metric calculation block 410 calculates the new value of the path (or state) metric at each stage (i.e., time instant) of the trellis. The minimum path metric is then output as a Stage Decision to trellis and traceback calculation block 415. ACS and path metric calculation block 410 reads the current path metrics (e.g., 4 path metrics) from current stage memory buffer 420 and adds the current path metrics to the branch metrics from branch metric calculation block 405 and stores the new path metrics in next stage memory buffer 425. Next stage memory buffer 425 and current stage memory buffer 420 then switch identities, so that next stage memory buffer 425 becomes current stage memory buffer 420 and current stage memory buffer 420 becomes next stage memory buffer 425.

Trellis and traceback calculation block 415 receives the stage decision values from ACS and path metric calculation block 410 and stores the hard decoded values in shared trellis history buffer. As described in more detail below in connection with FIGS. 5-7, after two segments of an entire block of symbol samples have been processed and the trellis for those segments is completed in shared trellis history buffer 370, trellis and traceback calculation block 415 then traces back through the shortest path in the trellis in order to decode the input sequence for the segments. However, the decoded input sequence for only the second segment to be decoded is provided as an output of the decoder. The process is repeated for additional segments until the entire input sequence has been decoded. This process allows shared trellis history buffer 370 to be reduced in size while minimizing performance degradation. For example, for one embodiment, shared trellis history buffer 370 may comprise a size that is twice the size of each segment. For other embodiments, however, shared trellis history buffer 370 may comprise any suitable size greater than the size of a segment.

In one embodiment, the reconfigurable Viterbi decoder in CRISP 100f provides fully programmable feed-forward channel decoding and traceback sessions that support: i) channel decoding with constraint lengths of, for example, K=5, K=6, K=7 and K=9; ii) puncture codes; and iii) rate=½, ⅓, ¼ and ⅙ by four, fully programmable polynomials. Shared trellis history buffer 370 may support up to 512 stages for K=9 or 8192 stages for K=5. The reconfigurable Viterbi decoder in CRISP 100f further supports a block length of symbol data in memory 350 that is fully programmable and also supports programmable traceback methods.

An external controller, such as baseband DSP subsystem 315 or MCU 370 programs the reconfigurable Viterbi decoder while CRISP 100f is in Wake-Up mode. The reconfigurable Viterbi decoder in CRISP 100f can then execute independently on the whole block of data in memory 350 based on the programmed registers and the dedicated instructions in block 430. Data is written to and read from memory 350 in CRISP 100f via the bus in interconnect 325. The addresses of shared input symbol buffers 360 and shared trellis history buffer 370 are fully programmable.

Figure 5:
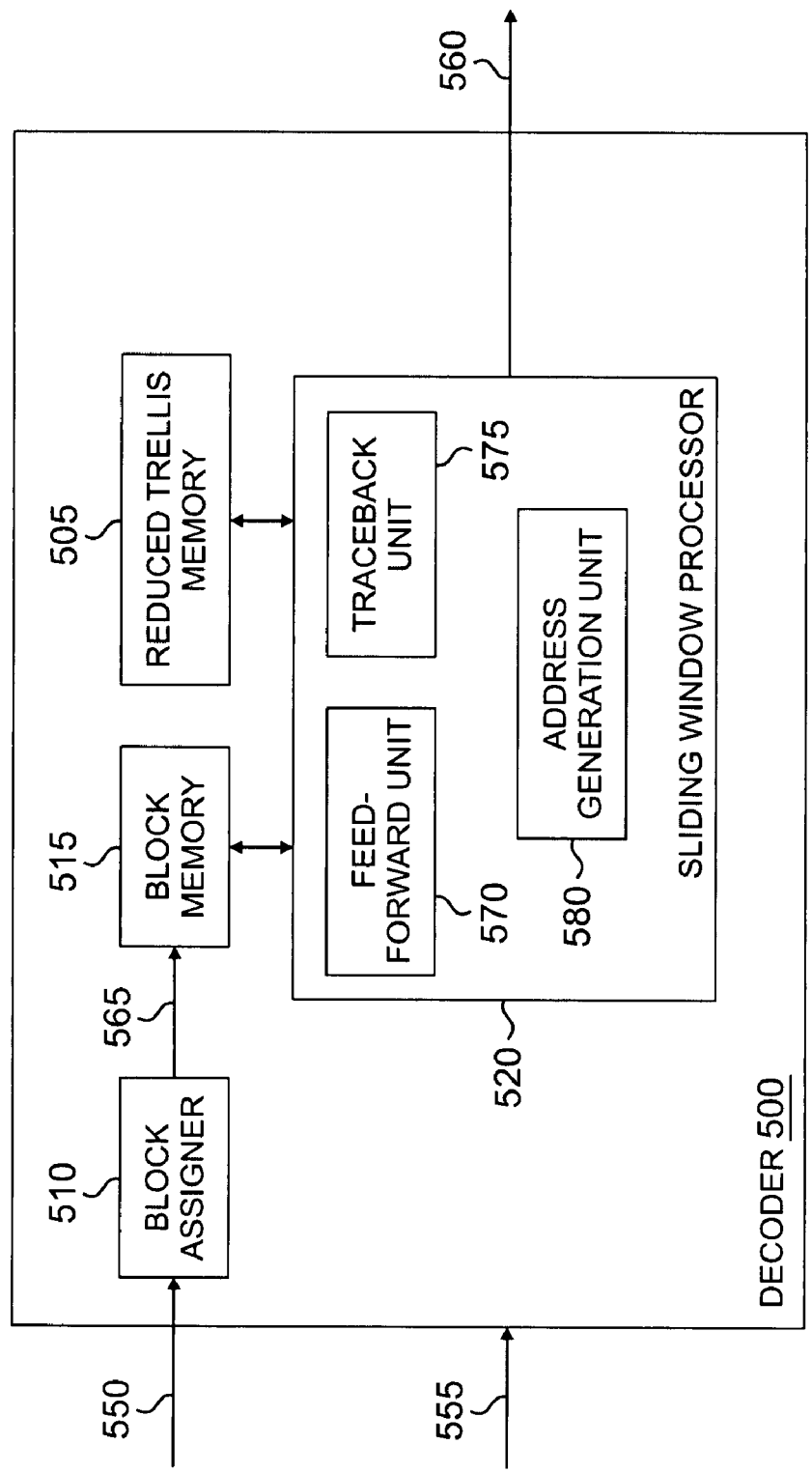
FIG. 5 is a high-level block diagram illustrating a Viterbi decoder having a reduced trellis memory according to one embodiment of the disclosure.

FIG. 5 is a high-level block diagram illustrating a Viterbi decoder 500 having a reduced trellis memory 505 according to one embodiment of the disclosure. As used herein, "reduced trellis memory" means a trellis memory having a substantially reduced size as compared to a trellis memory capable of storing a complete trellis for an entire block of data to be decoded. Although illustrated as an integrated component of decoder 500, it will be understood that reduced trellis memory 505 may be implemented as a separate component coupled to decoder 500.

In addition to reduced trellis memory 505, decoder 500 comprises block assigner 510, block memory 515, and sliding window processor 520. Decoder 500 is operable to receive as an input a stream of encoded information bits 550. For some embodiments, decoder 500 is also operable to receive operating parameters 555 as additional inputs. For one embodiment, operating parameters 555 may comprise a block size, a segment size, a reduced trellis memory size, a number of bits for one or more feed-forward processes, an initial traceback address, an offset for subsequent traceback addresses, a final traceback address and/or any other suitable parameters for use in decoding the information bits 550. It will be understood that some or all of the operating parameters 555 may be pre-programmed into components of decoder 500. Based on the information bits 550 and operating parameters 555, decoder 500 is operable to generate a decoder output 560, which corresponds to an original input sequence that was encoded and transmitted to a receiver comprising decoder 500.

Block assigner 510 is operable to receive the information bits 550 and assign a block of N bits to be processed together as a block 565. Block memory 515 is coupled to block assigner 510 and is operable to store the block 565 for processing. Sliding window processor 520 is operable to process the block 565 in segments. Each segment may have a segment size of S, with the exception of a final segment that may comprise a size smaller than S when the block size is not a multiple of the segment size.

Sliding window processor 520 comprises a feed-forward unit 570, a traceback unit 575 and an address generation unit (AGU) 580. Feed-forward unit 570 is operable to perform a feed-forward process on one or more segments of the block 565. Traceback unit 575 is operable to perform a traceback process on multiple segments of the block 565. AGU 580 is operable to generate addresses for feed-forward unit 570 and traceback unit 575 to use in accessing reduced trellis memory 505 and/or block memory 515. Sliding window processor 520 is also operable to generate the decoder output 560 based on the results of the traceback processes.

As described in more detail below in connection with FIGS. 6 and 7, feed-forward unit 570 is operable to perform the feed-forward process on one or more segments by generating a trellis to be stored in reduced trellis memory 505 for the one or more segments using any suitable Viterbi algorithm. AGU 580 is operable to provide feed-forward unit 570 with a starting address in block memory 515 for the segment(s) to be processed and with a starting address in reduced trellis memory 505 for storing the corresponding trellis.

Traceback unit 575 is operable to perform the traceback process on multiple segments by tracing back through the trellis stored in reduced trellis memory 505 for a number of bits based on the sizes of the segments being processed. Traceback unit 575 is operable to trace back through the trellis using any suitable Viterbi algorithm. AGU 580 is operable to provide traceback unit 575 with a starting address in reduced trellis memory 505 for the beginning point of the traceback process.

For each segment other than a final segment, sliding window processor 520 is operable to generate the decoder output 560 for a particular segment based on a traceback process performed by traceback unit 575 on the particular segment and a following segment. Thus, the learning period of the traceback process, which corresponds to unreliably decoded bits, may be performed on the following segment, allowing the decoder output 560 to be generated using only the reliably decoded bits of the particular segment. For the final segment, sliding window processor 520 is operable to generate the decoder output 560 based on a traceback process performed by traceback unit 575 on a penultimate segment and the final segment.

For Viterbi decoding, the learning period generally results in a number of unreliable decoded bits that is equal to 5×K, where K is the constraint length as described above. Thus, if the first at least 5×K bits decoded in a traceback process are discarded, the remaining decoded bits are generally reliable. Therefore, if the segment size S is at least 5×K, the decoded bits used to generate the decoder output 560 will be generally reliable.

Figure 6:
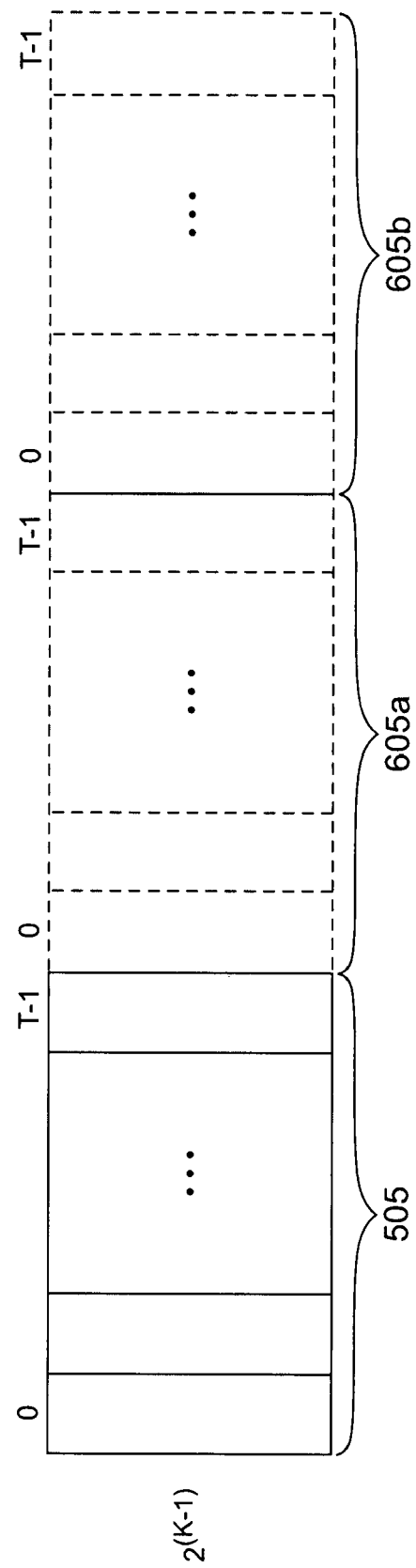
FIG. 6 is a block diagram of the reduced trellis memory of FIG. 5 according to one embodiment of the disclosure.

FIG. 6 is a block diagram of reduced trellis memory 505 according to one embodiment of the disclosure. Reduced trellis memory 505 comprises a size of $(2^{K-1}) \times T$, as compared to a standard trellis memory that comprises a size of $(2^{K-1}) \times N$. While N is the block size for a block 565, T may be any suitable value greater than the segment size, S. For one particular embodiment, T=2S. Thus, based on the size of each segment, S, compared to the size of the block, N, reduced trellis memory 505 may be significantly smaller than a standard trellis memory.

The illustration of FIG. 6 includes phantom trellis memories 605a and 605b that, together with reduced trellis memory 505, form a memory the size of a standard trellis memory. AGU 580 of decoder 500 is operable to perform a Modulo-T operation in order to translate addresses for a standard trellis memory into addresses for reduced trellis memory 505. Thus, addresses for locations in phantom trellis memories 605a-b are mapped into addresses for locations in reduced trellis memory 505. For example, an address for the location T−1 of phantom trellis memory 605a or 605b would be translated by AGU 580 into an address for the location T−1 of reduced trellis memory 505. Although illustrated with two phantom memories 605a-b, it will be understood that any suitable number of phantom memories 605 may be included based on the block size, N, and based on the size of reduced trellis memory 505.

Figure 7:
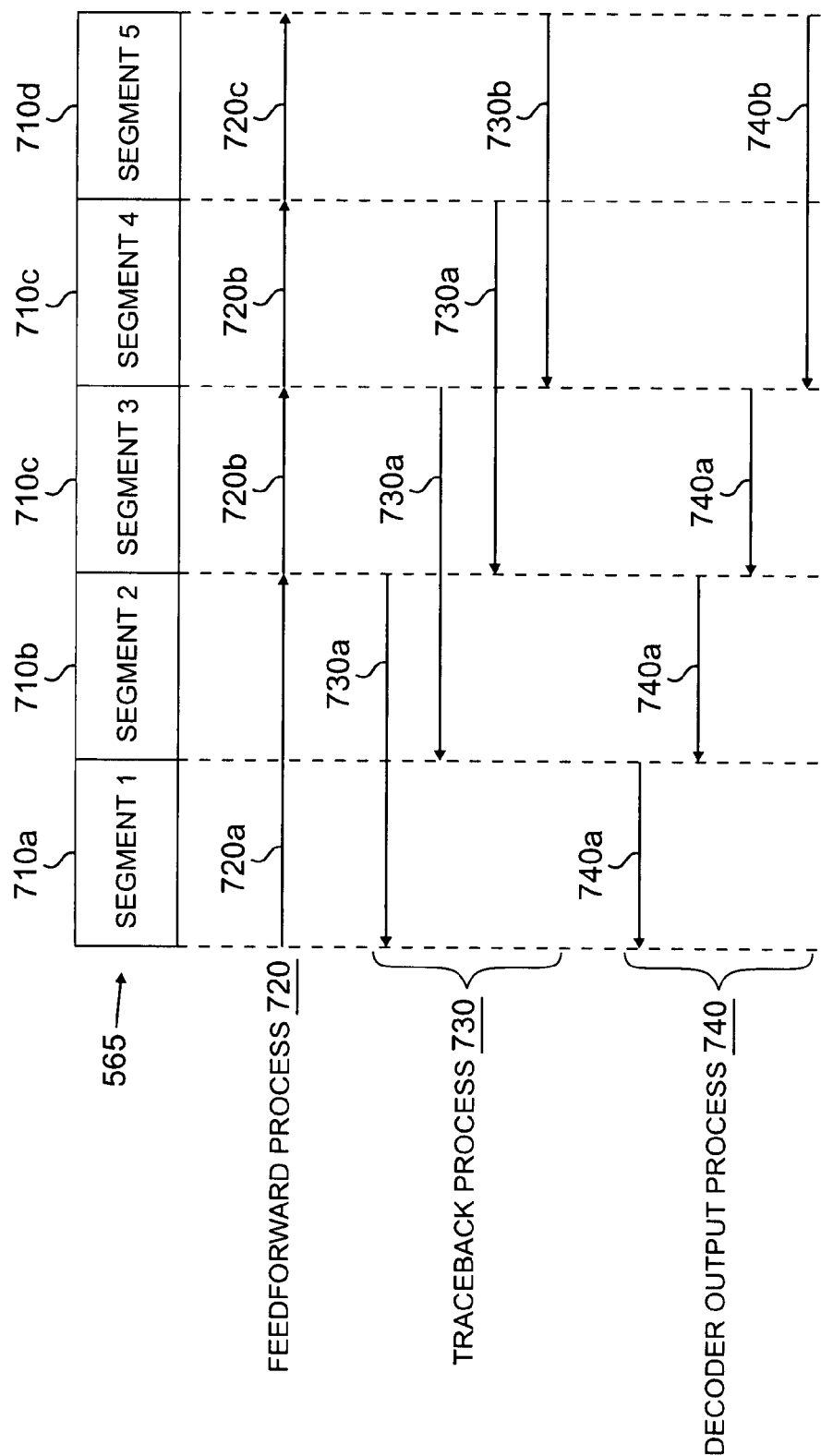
FIG. 7 illustrates the processing of a block of encoded data bits by the Viterbi decoder of FIG. 5 according to one embodiment of the disclosure.

FIG. 7 illustrates the processing of an example of a block 565 of encoded data bits by Viterbi decoder 500 according to one embodiment of the disclosure. For this example, a block 565 is divided virtually into five segments 710 of size S, and reduced trellis memory 505 comprises a size T=2S. It will be understood that block 565 may be divided into any suitable number of segments 710 without departing from the scope of this disclosure. For the illustrated example, Segment 1 comprises a first segment 710a, Segment 2 comprises a second segment 710b, Segment 3 and Segment 4 each comprise an inner segment 710c, and Segment 5 comprises a final segment 710d. Thus, in general, for blocks 565 divided into X segments 710, Segment 3 through Segment X−1 comprise inner segments 710c and Segment X comprises the final segment 710d.

Feed-forward unit 570 performs a feed-forward process 720, traceback unit 575 performs a traceback process 730, and sliding window processor 520 performs a decoder output process 740. For the example, feed-forward unit 570 performs an initial feed-forward process 720a by processing Segment 1 and Segment 2. The trellis generated by feed-forward unit 570 in performing the initial feed-forward process 720a is stored in reduced trellis memory 505.

Traceback unit 575 then performs a standard traceback process 730a by processing Segment 1 and Segment 2, beginning with the end of the trellis for Segment 2 and tracing back to the beginning of the trellis for Segment 1. In order to avoid possibly unreliable bits at the beginning of the traceback process 730a, sliding window processor 520 performs a standard decoder output process 740a to generate a decoder output 560 based only on the traceback result for Segment 1, discarding the traceback result for Segment 2.

Feed-forward unit 570 then performs a subsequent feed-forward process 720b by processing Segment 3. The trellis generated by feed-forward unit 570 in performing the subsequent feed-forward process 720b is stored in the first half of reduced trellis memory 505, overwriting the trellis generated by processing Segment 1.

Traceback unit 575 then performs another standard traceback process 730a by processing Segment 2 and Segment 3, beginning with the end of the trellis for Segment 3 and tracing back to the beginning of the trellis for Segment 2. Once the beginning of the reduced trellis memory 505 is reached after traceback unit 575 traces back through Segment 3, traceback unit 575 wraps around to the end of reduced trellis memory 505 and traces back through Segment 2. In order to avoid possibly unreliable bits at the beginning of the traceback process 730a, sliding window processor 520 performs a standard decoder output process 740a to generate a decoder output 560 based only on the traceback result for Segment 2, discarding the traceback result for Segment 3.

Feed-forward unit 570 then performs a subsequent feed-forward process 720b by processing Segment 4. The trellis generated by feed-forward unit 570 in performing the subsequent feed-forward process 720b is stored in the second half of reduced trellis memory 505, overwriting the trellis generated by processing Segment 2.

Traceback unit 575 then performs another standard traceback process 730a by processing Segment 3 and Segment 4, beginning with the end of the trellis for Segment 4 and tracing back to the beginning of the trellis for Segment 3. In order to avoid possibly unreliable bits at the beginning of the traceback process 730a, sliding window processor 520 performs a standard decoder output process 740*a* to generate a decoder output 560 based only on the traceback result for Segment 3, discarding the traceback result for Segment 4.

Feed-forward unit 570 then performs a final feed-forward process 720*c* by processing Segment 5. The trellis generated by feed-forward unit 570 in performing the final feed-forward process 720*c* is stored in at least a portion of the first half of reduced trellis memory 505, overwriting at least a portion of the trellis generated by processing Segment 3 (depending on the size of the final segment 710*d* as compared to the size of the other segments 710*a-c*).

Traceback unit 575 then performs a final traceback process 730*b* by processing Segment 4 and Segment 5, beginning with the end of the trellis for Segment 5 and tracing back to the beginning of the trellis for Segment 4. Sliding window processor 520 performs a final decoder output process 740*b* to generate a decoder output 560 based on the traceback result for Segment 4 and for Segment 5.

In the more general case, the initial feed-forward process 720*a* is performed by processing the first and second segments 710*a* and 710*b*. Thus, the initial feed-forward process 720*a* is performed on a number of bits that is equal to the size of two segments 710*a-b*. For the initial feed-forward process 720*a*, AGU 580 may provide feed-forward unit 570 with a starting address in block memory 515 for the first segment 710*a* and with a starting address in reduced trellis memory 505 for storing the corresponding trellis generated by the initial feed-forward process 720*a*.

Each subsequent feed-forward process 720*b* is performed by processing one of the inner segments 710*c*. Thus, the subsequent feed-forward process 720*b* is performed on a number of bits that is equal to the size of one inner segment 710*c*. For each subsequent feed-forward process 720*b*, AGU 580 may provide feed-forward unit 570 with a starting address in block memory 515 for the inner segment 710*c* and with a starting address in reduced trellis memory 505 for storing the corresponding trellis generated by the subsequent feed-forward process 720*b*. For another embodiment, instead of being provided with a starting address in block memory 515 by AGU 580, feed-forward unit 570 may simply continue with a next address in block memory 515 following the final bit of the previously processed segment 710*b-c*.

The final feed-forward process 720*c* is performed by processing the final segment 710*d*. Thus, the final feed-forward process 720*c* is performed on a number of bits that is equal to the size of the final segment 710*d*, which may be equal to or less than the size of the other segments 710*a-c*, as described above. For the final feed-forward process 720*c*, AGU 580 may provide feed-forward unit 570 with a starting address in block memory 515 for the final segment 710*d* and with a starting address in reduced trellis memory 505 for storing the corresponding trellis generated by the final feed-forward process 720*c*. For another embodiment, instead of being provided with a starting address for the final segment 710*d* in block memory 515 by AGU 580, feed-forward unit 570 may simply continue with a next address in block memory 515 following the final bit of the previously processed segment 710*c*.

The standard traceback process 730*a* is performed by processing two segments 710*a-c* in reverse order. The standard traceback process 730*a* begins with the segment 710*a-c* most recently processed in a feed-forward process 720 and continues back through the previous segment 710*a-c*. Thus, each standard traceback process 730*a* is performed on a number of bits that is equal to the size of two segments 710*a-c*. Because each subsequent feed-forward process 720*b* is performed on a single segment 710*b-c*, the standard traceback process 730*a* is performed on overlapping segment pairs. Each standard traceback process 730*a* traces back through the segment 710*a-c* most recently processed in a feed-forward process 720 to generate a traceback result that may be discarded as unreliable and then and continues to trace back through the previous segment 710*a-c* to generate a traceback result that may be used as a reliable decoder output 560. Because the segment pairs processed in this way are overlapping, each segment 710*b-c* other than the first segment 710*a* and the final segment 710*d* is used first for the learning period and then again to generate a reliable result.

For the standard traceback process 730*a*, AGU 580 may provide traceback unit 575 with a starting address in reduced trellis memory 505 for the beginning point of the traceback process 730*a*. For one embodiment, AGU 580 may generate each starting address after the initial starting address by adding an offset to the previous starting address and performing a Modulo-T operation to translate the resulting address to an address in reduced trellis memory 505. The offset may comprise the length of a segment 710*a-c*.

The final traceback process 730*b* is performed by processing a penultimate segment 710*c*, which is the $(X-1)^{th}$ segment 710*c*, and the final segment 710*d*. Thus, the final traceback process 730*b* is performed on a number of bits that is equal to the size of the final segment 710*d* added to the size of the penultimate segment 710*c*. For the final traceback process 730*b*, AGU 580 may provide traceback unit 575 with a starting address in reduced trellis memory 505 for the beginning point of the traceback process 730*b*. For one embodiment, if the block size is a multiple of the segment size, AGU 580 may generate the starting address for the final traceback process 730*b* by adding the offset to the previous starting address and performing a Modulo-T operation to translate the resulting address to an address in reduced trellis memory 505.

The standard decoder output process 740*a* is performed by processing one segment 710*a-c*, i.e., the segment 710*a-c* through which traceback unit 575 most recently traced back. The standard decoder output process 740*a* is performed on a number of bits that is equal to the size of one segment 710*a-c*. The final decoder output process 740*b* is performed by processing the penultimate segment 710*c* and the final segment 710*d*. Thus, the final decoder output process 740*b* is performed on a number of bits that is equal to the size of the final segment 710*d* added to the size of the penultimate segment 710*c*.

Using the process illustrated in FIG. 7, the first S bits decoded by each standard traceback process 730*a* are unused in generating the decoder output 560. Thus, if the segment size, S, is at least 5×K, which is the number of unreliable bits at the beginning of any traceback process for Viterbi decoding, then the unreliable bits are discarded for each standard traceback process 730*a*. Therefore, the decoding process may be performed using a limited size trellis memory 505 while performance degradation, as compared to a decoding process that uses a full size trellis memory, is minimized.

In this way, the overhead time introduced by sliding window algorithms that process each block independently is significantly reduced. In addition, by using only a few additional registers, decoder 500 may support any type of sliding window with any suitable size of feed-forward and traceback. For the embodiment in which this process is performed automatically in CRISP 100*f*, the overhead MIPS is significantly offloaded from the host processor while total flexibility is provided. The process may be implemented using any suitable constraint length, K, any suitable block size, N, any suitable segment size, S, and/or any suitable standard.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for performing Viterbi decoding using a reduced trellis memory, comprising:
   dividing, at a sliding window processor coupled to the reduced trellis memory, a block of data into a plurality of segments;
   performing, at the sliding window processor, a feed-forward process on each of the segments to generate a trellis for each of the segments;
   performing, at the sliding window processor, a traceback process on each of a plurality of overlapping segment pairs, each segment pair comprising a first segment and a second segment, to generate a traceback result for the first segment and a traceback result for the second segment; and
   discarding, at the sliding window processor, the traceback result for the second segment to generate a decoder output based on the traceback result for the first segment.

2. The method as set forth in claim 1, performing the feed-forward process on each of the segments to generate a trellis for each of the segments comprising performing an initial feed-forward process on two segments to generate a trellis for each of the two segments, the method further comprising storing the trellis for each of the two segments in the reduced trellis memory.

3. The method as set forth in claim 2, performing the feed-forward process on each of the segments to generate a trellis for each of the segments further comprising performing a subsequent feed-forward process on a first inner segment to generate a trellis for the first inner segment, the method further comprising overwriting the trellis for a first one of the two segments by storing the trellis for the first inner segment in the reduced trellis memory.

4. The method as set forth in claim 3, performing the feed-forward process on each of the segments to generate a trellis for each of the segments further comprising performing the subsequent feed-forward process on a second inner segment to generate a trellis for the second inner segment, the method further comprising overwriting the trellis for a second one of the two segments by storing the trellis for the second inner segment in the reduced trellis memory.

5. The method as set forth in claim 1, the segments comprising a plurality of non-final segments and a final segment, each non-final segment comprising a size of S, the reduced trellis memory comprising a size of $(2^{K-1}) \times T$, wherein K comprises a constraint length and T comprises a value greater than S.

6. The method as set forth in claim 5, wherein S comprises at least $5 \times K$.

7. The method as set forth in claim 5, wherein S comprises $5 \times K$ and T comprises 2S.

8. The method as set forth in claim 1, further comprising:
   performing the traceback process on a final segment pair to generate a traceback result for the first segment of the final segment pair and a traceback result for the second segment of the final segment pair; and
      generating a final decoder output based on the traceback result for the first segment of the final segment pair and the traceback result for the second segment of the final segment pair.

9. A method for performing Viterbi decoding using a reduced trellis memory, comprising:
   dividing, at a sliding window processor coupled to the reduced trellis memory, a block of data into a plurality of segments;
   performing, at the sliding window processor, a feed-forward process on a first segment to generate a trellis for the first segment;
   performing, at the sliding window processor, the feed-forward process on a second segment to generate a trellis for the second segment;
   performing, at the sliding window processor, a single traceback process on the trellis for the first segment and the trellis for the second segment to generate a traceback result for the first segment and a traceback result for the second segment; and
   discarding, at the sliding window processor, the traceback result for the second segment to generate a decoder output based on the traceback result for the first segment.

10. The method as set forth in claim 9, further comprising:
    performing the feed-forward process on a third segment to generate a trellis for the third segment;
    performing a single traceback process on the trellis for the second segment and the trellis for the third segment to generate a second traceback result for the second segment and a traceback result for the third segment; and
    discarding the traceback result for the third segment to generate a decoder output based on the second traceback result for the second segment.

11. The method as set forth in claim 10, further comprising:
    storing the trellis for the first segment in a first half of the reduced trellis memory;
    storing the trellis for the second segment in a second half of the reduced trellis memory; and
    overwriting the trellis for the first segment by storing the trellis for the third segment in the first half of the reduced trellis memory.

12. The method as set forth in claim 9, the segments comprising a plurality of non-final segments and a final segment, each non-final segment comprising a size of S, the reduced trellis memory comprising a size of $(2^{K-1}) \times T$, wherein K comprises a constraint length and T comprises a value greater than S.

13. The method as set forth in claim 12, wherein S comprises at least $5 \times K$.

14. The method as set forth in claim 12, wherein S comprises $5 \times K$ and T comprises 2S.

15. The method as set forth in claim 9, further comprising:
    performing the feed-forward process on a penultimate segment to generate a trellis for the penultimate segment;
    performing the feed-forward process on a final segment to generate a trellis for the final segment;
    performing the single traceback process on the trellis for the penultimate segment and the trellis for the final segment to generate a traceback result for the penultimate segment and a traceback result for the final segment; and
    generating a final decoder output based on the traceback result for the penultimate segment and the traceback result for the final segment.

16. A Viterbi decoder, comprising:
    a block memory operable to store a block of data divided into a plurality of segments;
    a sliding window processor coupled to the block memory, the sliding window processor operable to perform a feed-forward process on each of the segments to generate a trellis for each of the segments;

a reduced trellis memory coupled to the sliding window processor, the reduced trellis memory operable to store the trellis for a first segment and the trellis for a second segment; and the sliding window processor further operable (i) to perform a single traceback process on the trellis for the first segment and the trellis for the second segment to generate a traceback result for the first segment and a traceback result for the second segment and (ii) to discard the traceback result for the second segment to generate a decoder output based on the traceback result for the first segment.

17. The Viterbi decoder as set forth in claim 16, the sliding window processor operable to store the trellis for the first segment in a first half of the reduced trellis memory and the trellis for the second segment in a second half of the reduced trellis memory.

18. The Viterbi decoder as set forth in claim 17, the sliding window processor further operable to overwrite the trellis for the first segment by storing the trellis for a third segment in the first half of the reduced trellis memory.

19. The Viterbi decoder as set forth in claim 18, the sliding window processor further operable (i) to perform the single traceback process on the trellis for the second segment and the trellis for the third segment to generate a second traceback result for the second segment and a traceback result for the third segment and (ii) to discard the traceback result for the third segment to generate a decoder output based on the second traceback result for the second segment.

20. The Viterbi decoder as set forth in claim 16, the segments comprising a plurality of non-final segments and a final segment, each non-final segment comprising a size of S, the reduced trellis memory comprising a size of $(2^{K-1}) \times T$, wherein K comprises a constraint length and T comprises a value greater than S.

21. The Viterbi decoder as set forth in claim 20, wherein S comprises at least 5×K.

22. The Viterbi decoder as set forth in claim 20, wherein S comprises 5×K and T comprises 2S.

23. The Viterbi decoder as set forth in claim 16, further comprising:

the reduced trellis memory operable to store the trellis for a penultimate segment and the trellis for a final segment; and the sliding window processor further operable (i) to perform the single traceback process on the trellis for the penultimate segment and the trellis for the final segment to generate a traceback result for the penultimate segment and a traceback result for the final segment and (ii) to generate a final decoder output based on the traceback result for the penultimate segment and the traceback result for the final segment.

* * * * *